(12) United States Patent
Kueper

(10) Patent No.: US 8,399,286 B2
(45) Date of Patent: Mar. 19, 2013

(54) SEMICONDUCTOR DEVICE AND METHOD OF MAKING THEREOF

(75) Inventor: Timothy Kueper, Santa Clara, CA (US)

(73) Assignee: MiaSole, Santa Clara, CA (US)

( * ) Notice: Subject to any disclaimer, the term of this patent is extended or adjusted under 35 U.S.C. 154(b) by 585 days.

(21) Appl. No.: 12/654,185

(22) Filed: Dec. 14, 2009

(65) Prior Publication Data

US 2011/0139222 A1    Jun. 16, 2011

(51) Int. Cl.
*H01L 21/00* (2006.01)

(52) U.S. Cl. ............. 438/98; 438/80; 438/458; 136/256

(58) Field of Classification Search .................... 438/80, 438/98, 458
See application file for complete search history.

(56) References Cited

U.S. PATENT DOCUMENTS 7,544,884 B2    6/2009    Hollars

OTHER PUBLICATIONS

U.S. Appl. No. 12/385,571, filed Apr. 13, 2009, Juliano et al.

*Primary Examiner* — David Vu
*Assistant Examiner* — Earl Taylor
(74) *Attorney, Agent, or Firm* — The Marbury Law Group, PLLC

(57) ABSTRACT

A method of making a semiconductor device includes providing a web substrate, forming a first semiconductor layer of a first conductivity type over the web substrate, forming a second semiconductor layer of a second conductivity type over a first side of the first semiconductor layer, forming a first electrode layer over the second semiconductor layer, forming a handle web substrate over the first electrode layer, delaminating the web substrate from the first semiconductor layer after the step of forming the handle web substrate, where at least one opening extends through the first and the second semiconductor layers, and forming a second electrode layer over a second side of the first semiconductor layer such that the first and second electrode layers are in electrical contact with each other.

24 Claims, 15 Drawing Sheets

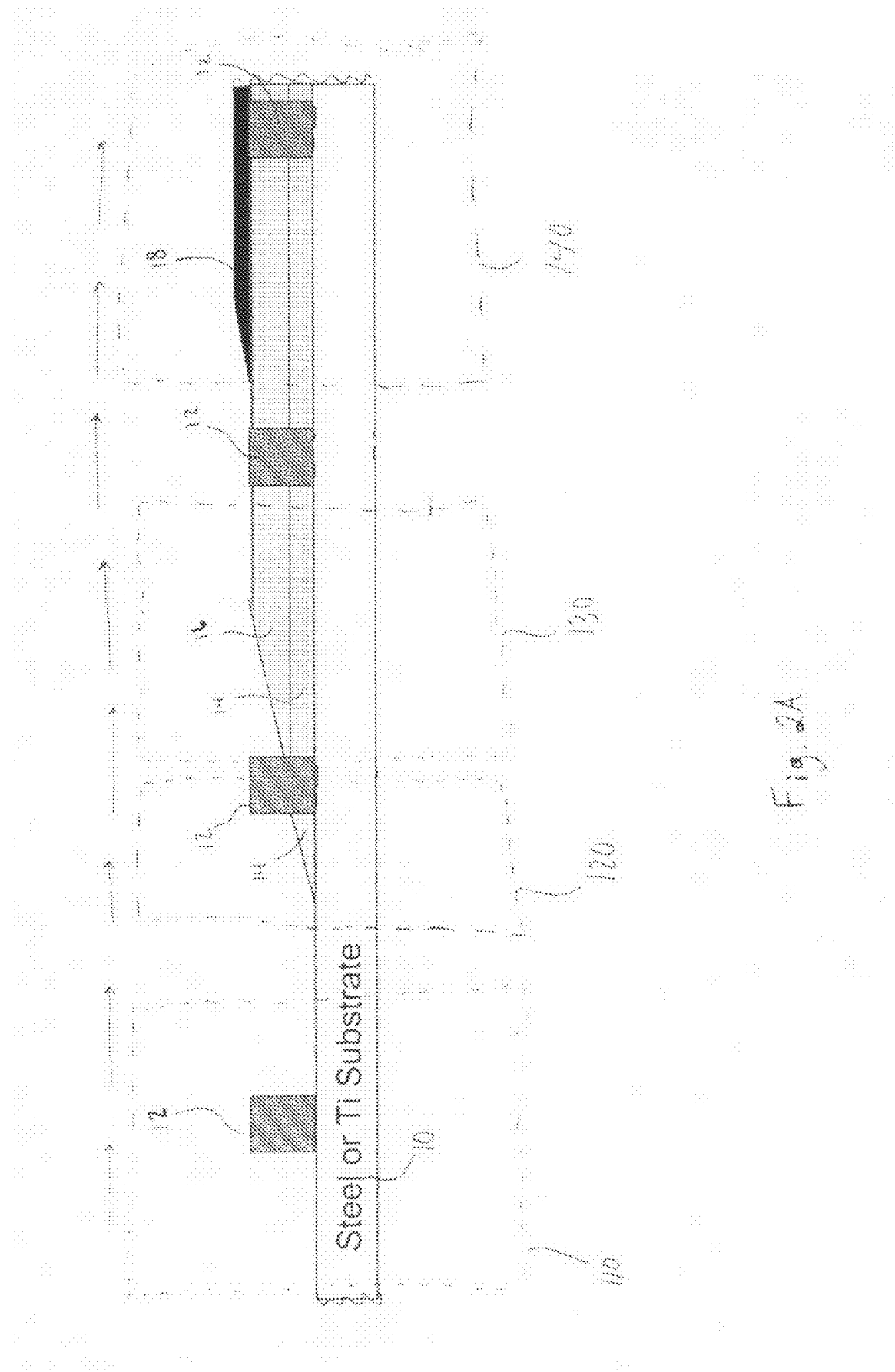

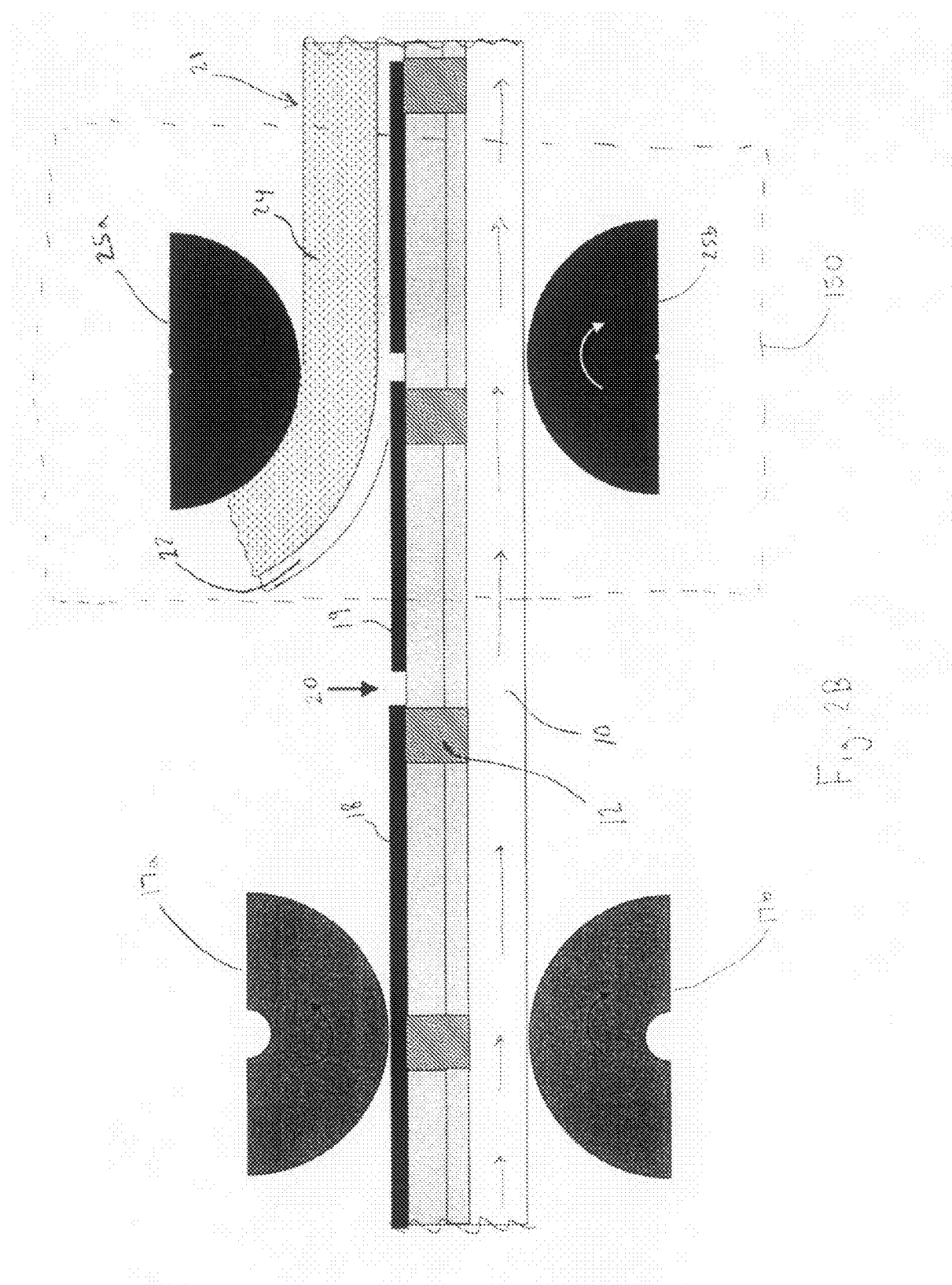

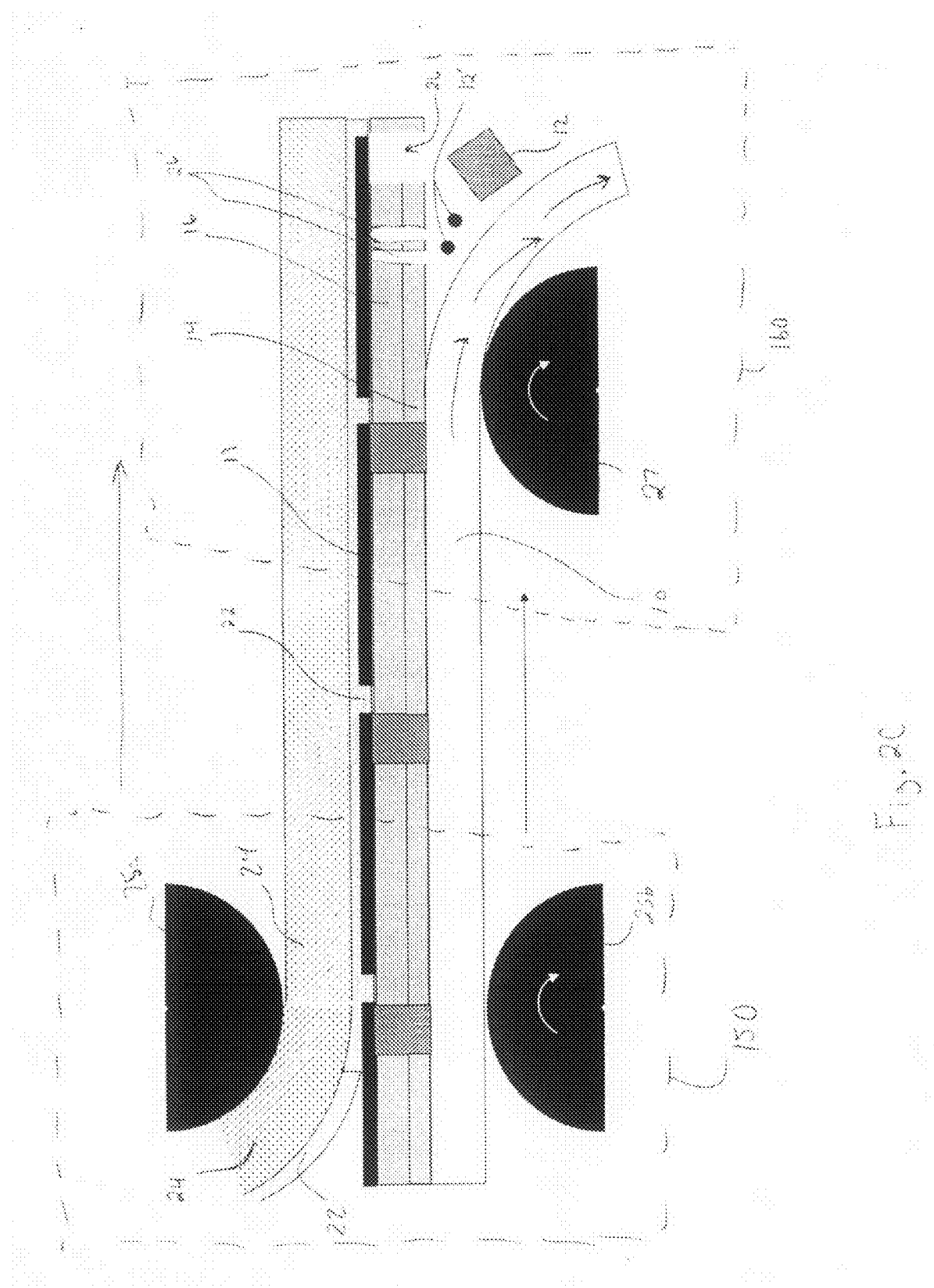

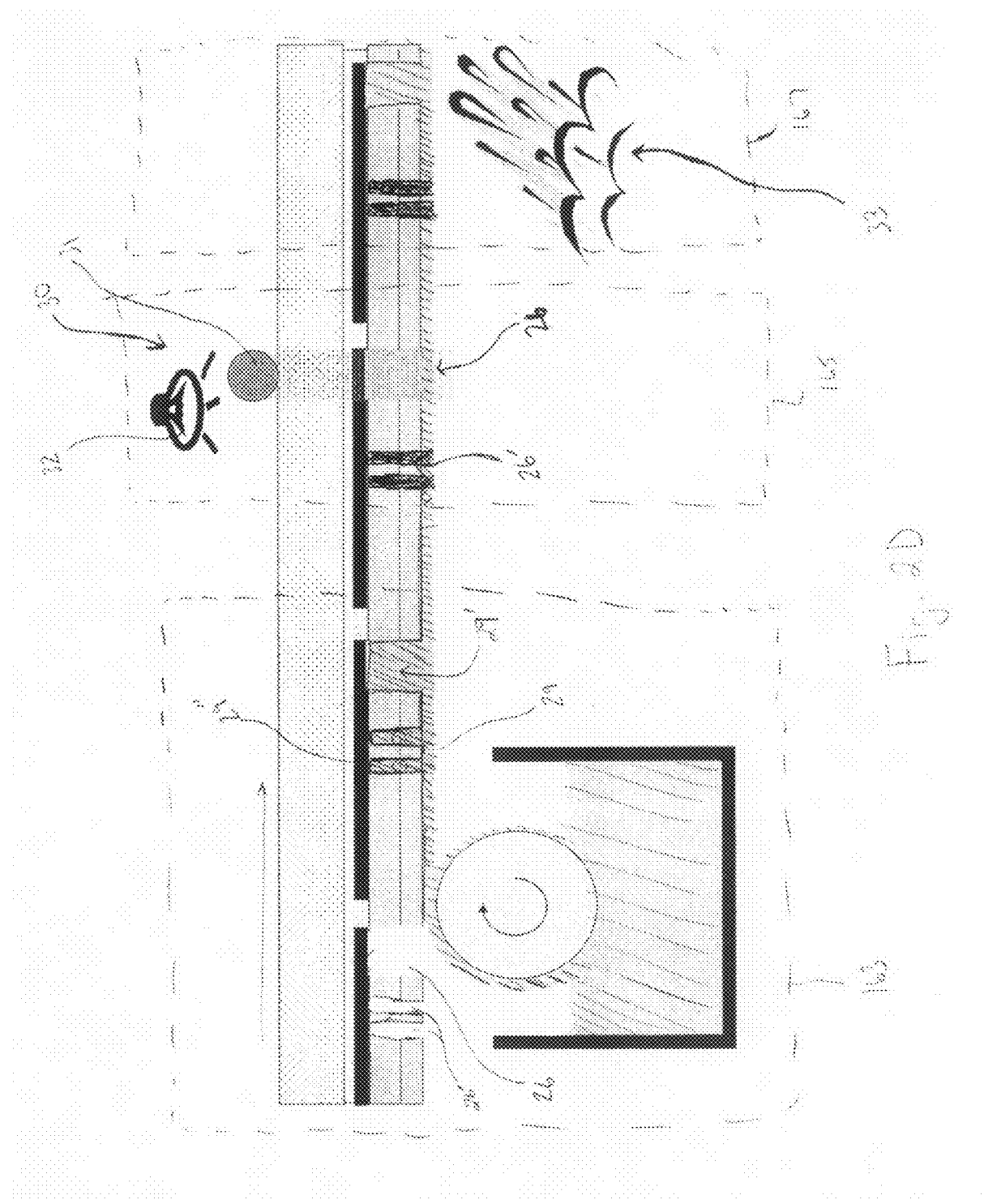

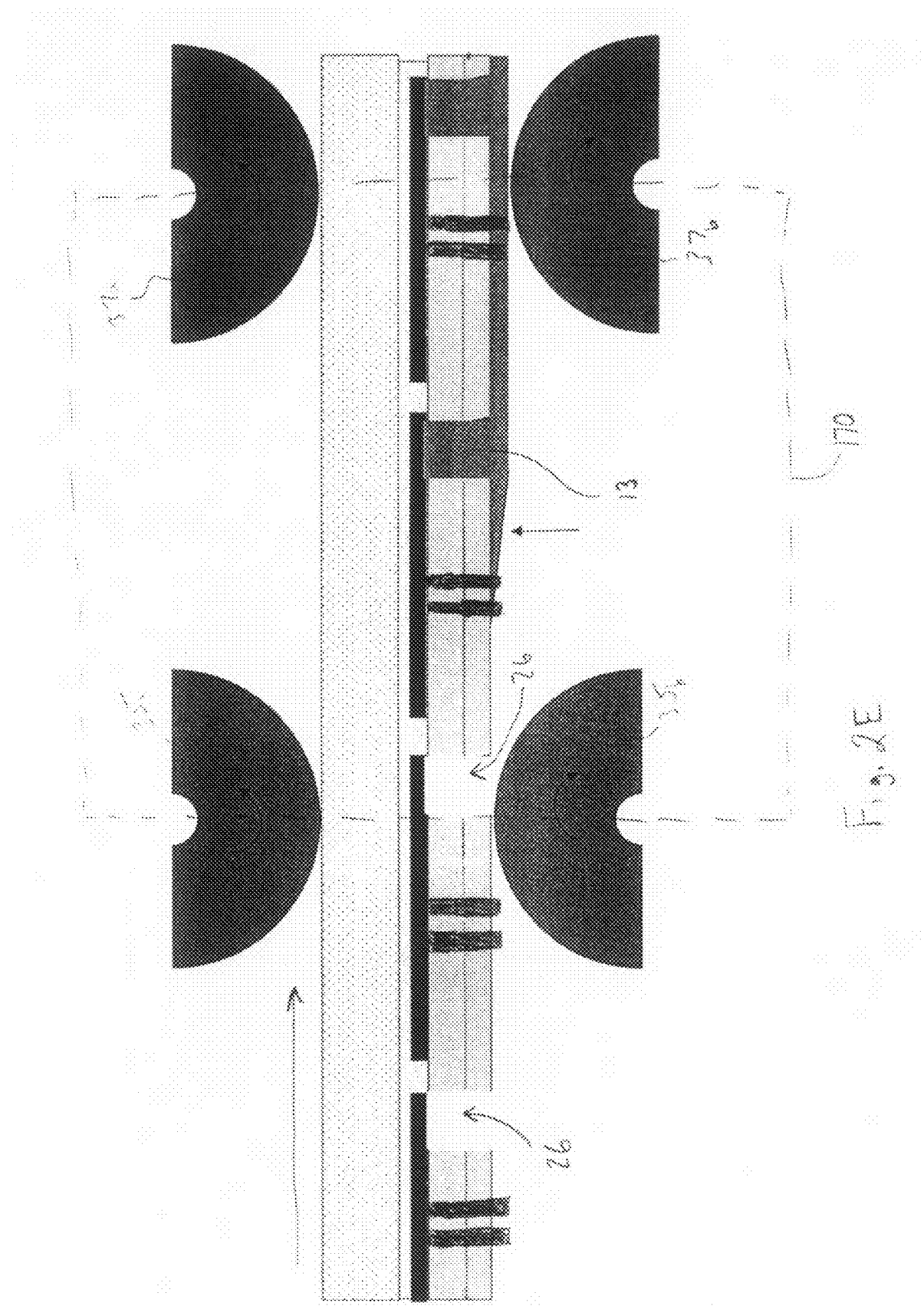

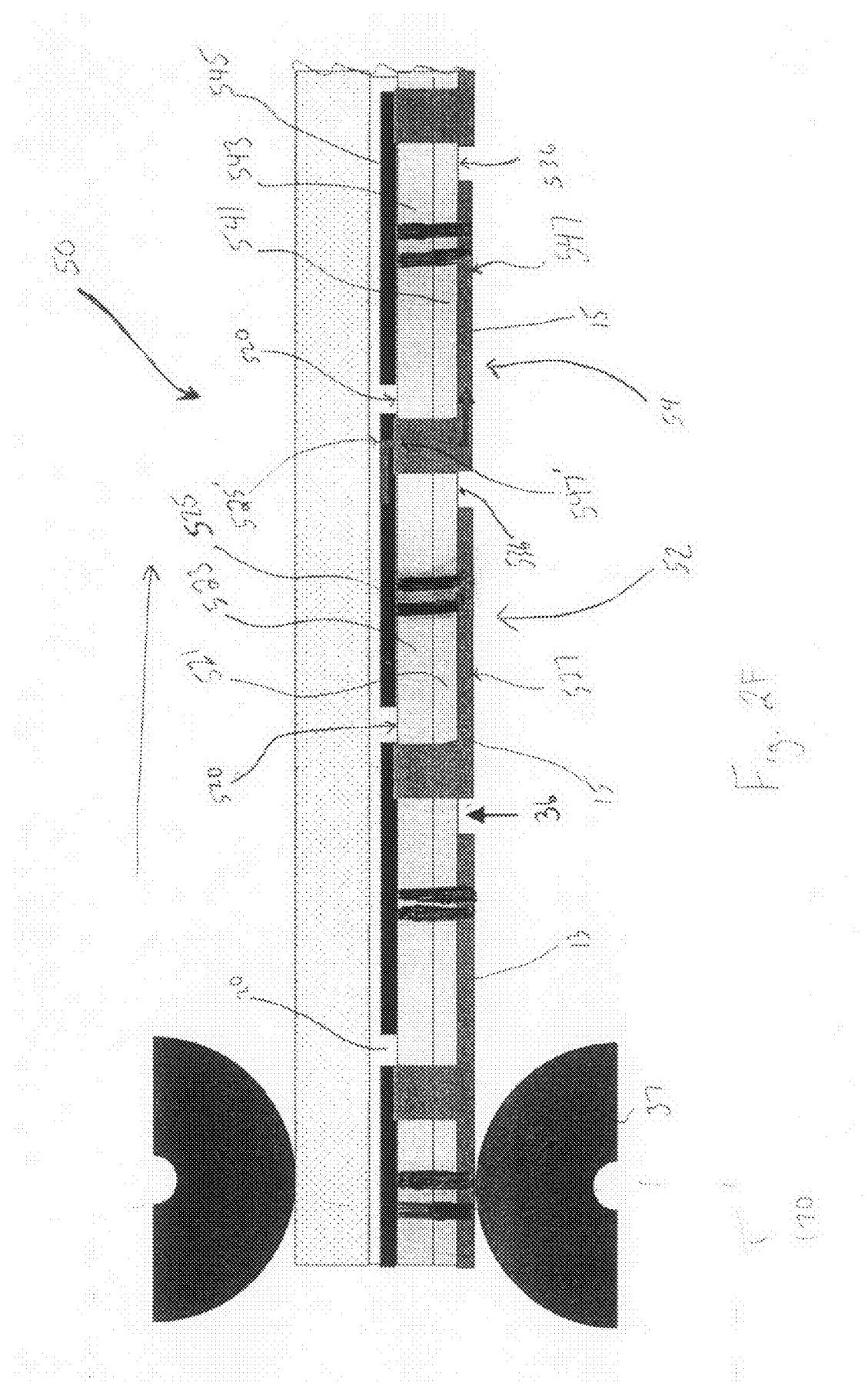

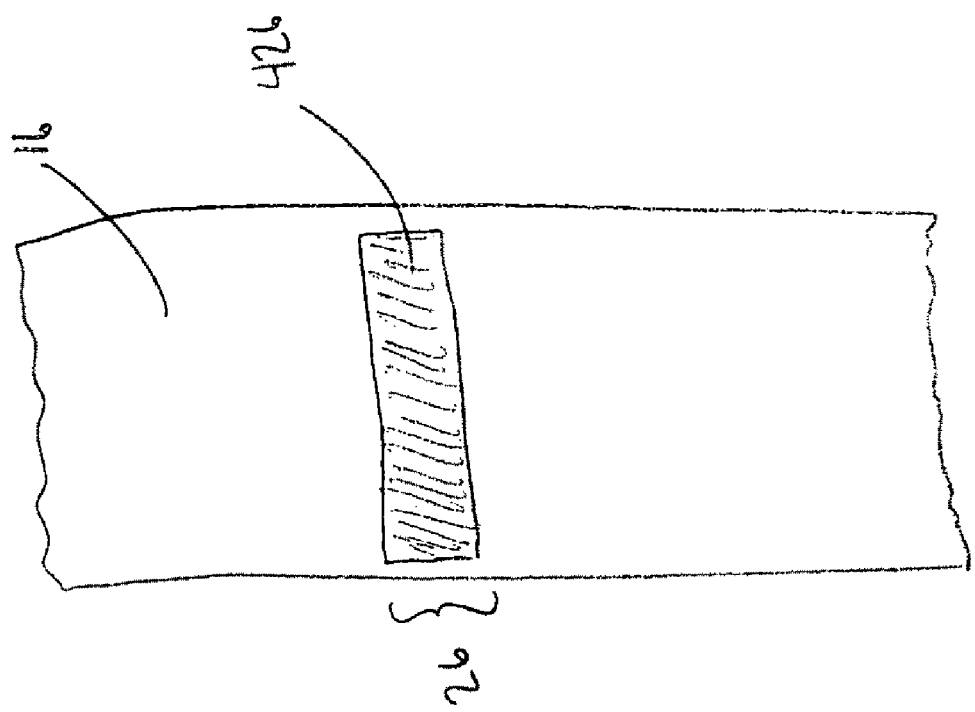

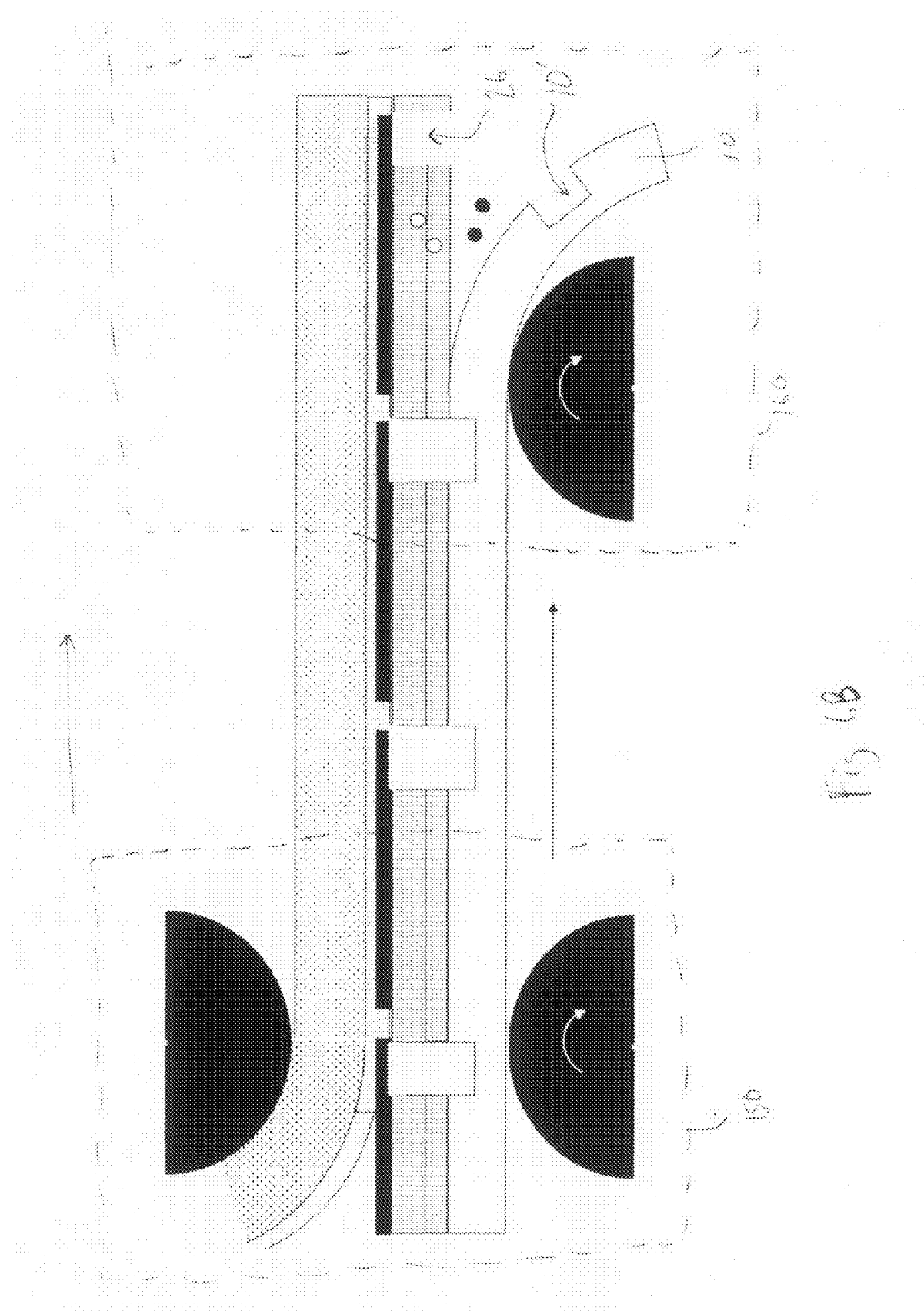

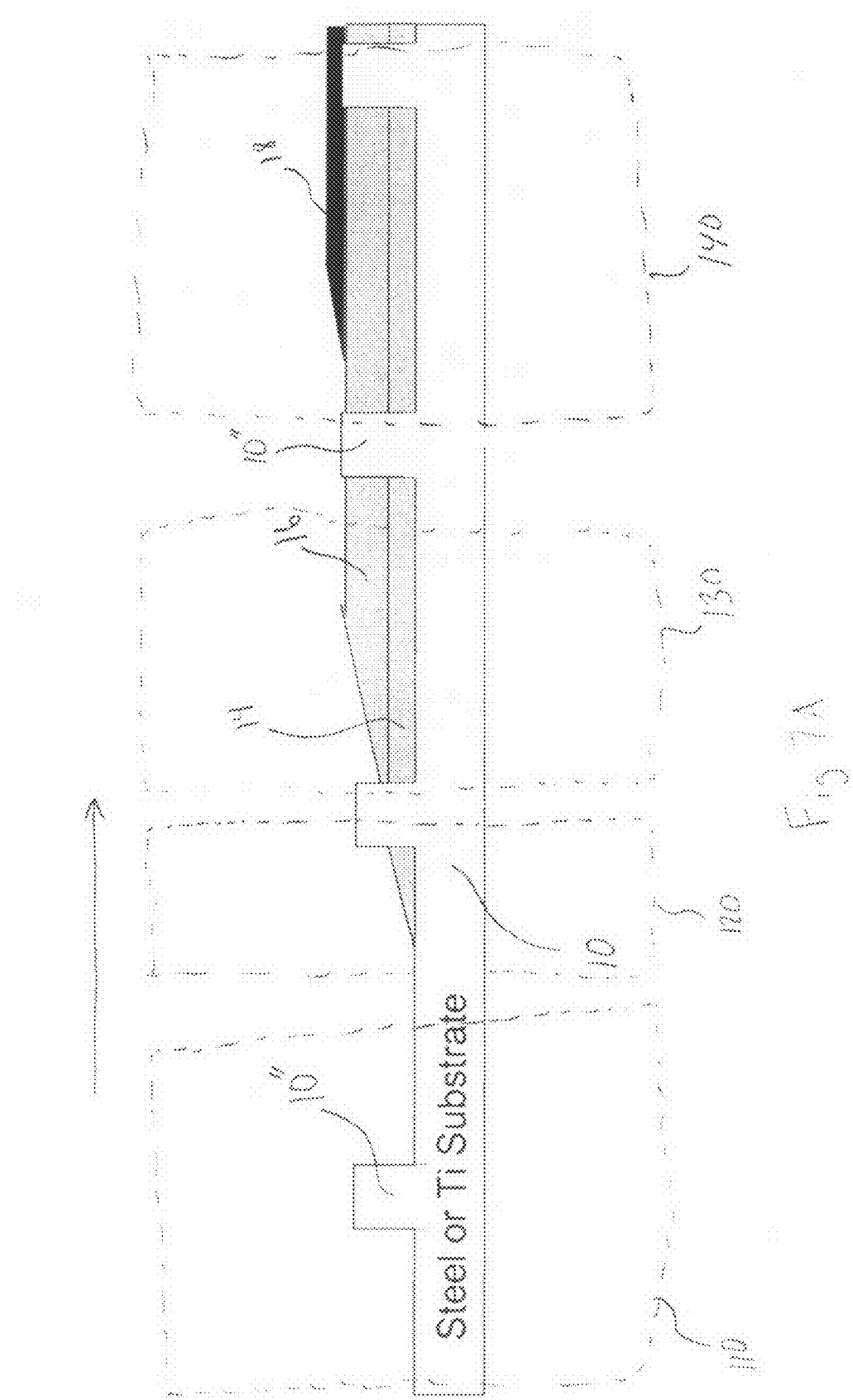

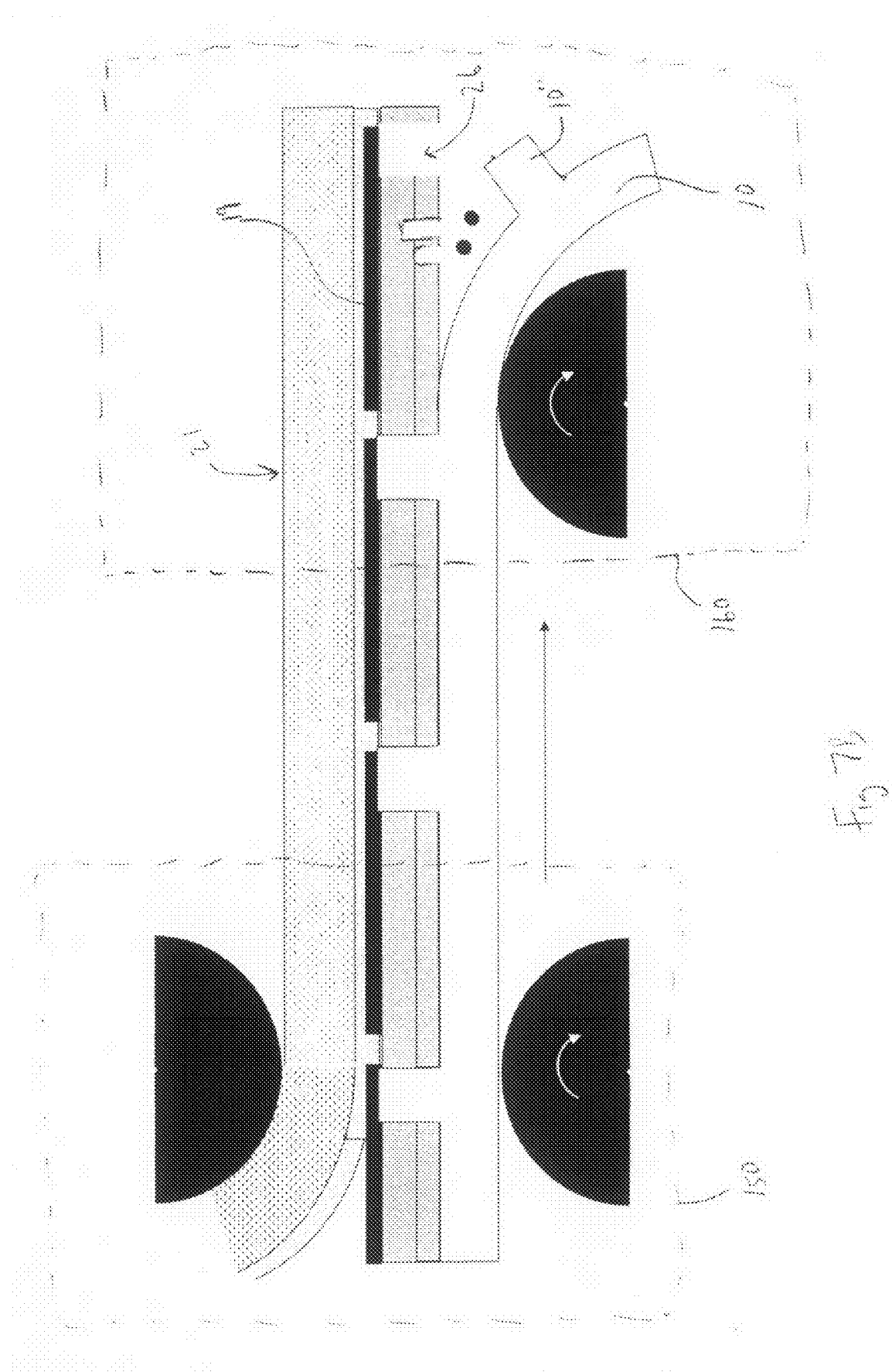

SEMICONDUCTOR DEVICE AND METHOD OF MAKING THEREOF

BACKGROUND

The present invention is directed to semiconductor devices, such as photovoltaic cells and methods of making thereof. Copper indium diselenide (CuInSe$_2$, or CIS) and its higher band gap variants copper indium gallium diselenide (Cu(In,Ga)Se$_2$, or CIGS), copper indium aluminum diselenide (Cu(In,Al)Se$_2$), copper indium gallium aluminum diselenide (Cu(In,Ga,Al)Se$_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors.

SUMMARY

One embodiment of the invention provides a method of making a semiconductor device, including providing a web substrate, forming a first semiconductor layer of a first conductivity type over the web substrate, forming a second semiconductor layer of a second conductivity type over a first side of the first semiconductor layer, forming a first electrode layer over the second semiconductor layer, forming a handle web substrate over the first electrode layer, delaminating the web substrate from the first semiconductor layer after the step of forming the handle web substrate, wherein at least one opening extends through the first and the second semiconductor layers, and forming a second electrode layer over a second side of the first semiconductor layer such that the first and second electrode layers are in electrical contact with each other.

Another embodiment of the invention provides a method of making a photovoltaic device, including providing a web substrate, forming discrete rows or zones of particles on the web substrate, wherein the rows or zones extend in a direction substantially perpendicular to a movement direction of the web substrate, forming a first semiconductor layer of a first conductivity type over the web substrate, wherein the first semiconductor layer is or ends up being absent at a location of each row or zone of particles, and forming a second semiconductor layer of a second conductivity type over a first side of the first semiconductor layer, wherein the second semiconductor layer is or ends up being absent at a location of each row or zone of particles. Additionally, this embodiment includes forming a first electrode layer over the second semiconductor layer, separating the first electrode layer into a plurality of discrete first electrodes, forming a handle web substrate over the plurality of discrete first electrodes, delaminating the web substrate from the first semiconductor layer after the step of forming the handle web substrate, such that the particles drop away from their location and form a plurality of discrete openings through the first and the second semiconductor layers by at least one of directly by an absence of the particles or indirectly through inducing fracture in a nearby area of the first and the second semiconductor layers, wherein the plurality of discrete openings are arranged in a plurality of rows or zones in a direction substantially perpendicular to a movement direction of the web substrate, and wherein the first and the second semiconductor layers remain continuous between the plurality of discrete openings in each of the plurality of rows or zones, forming a second electrode layer over a second side of the first semiconductor layer and in the plurality of discrete openings, and separating the second electrode layer into a plurality of discrete second electrodes, such that each of the plurality of discrete first electrodes is in electrical contact with a respective discrete second electrode.

Another embodiment of the invention provides a photovoltaic device, comprising a first photovoltaic cell including (i) a first portion of a first semiconductor layer of a first conductivity type, (ii) a first portion of a second semiconductor layer of a second conductivity type, (iii) a first electrode contacting the first portion of the second semiconductor layer, and (iv) a second electrode contacting the first portion of the first semiconductor layer. This embodiment further provides a second photovoltaic cell including (i) a second portion of the first semiconductor layer of a first conductivity type, (ii) the second portion of a second semiconductor layer of the second conductivity type, (iii) a first electrode contacting the second portion of the second semiconductor layer, and (iv) a second electrode contacting the second portion of the first semiconductor layer. Additionally, this embodiment provides that the second electrode of the second photovoltaic cell electrically contacts the first electrode of the first photovoltaic cell, and the second electrode of the second photovoltaic cell electrically shorts at least one of: (a) the first portion of the first semiconductor layer to the first portion of the second semiconductor layer, (b) the second portion of the first semiconductor layer to the second portion of the second semiconductor layer, (c) the first portion of the first semiconductor layer to the second portion of the first semiconductor layer, or (d) the first portion of the second semiconductor layer to the second portion of the second semiconductor layer.

BRIEF DESCRIPTION OF THE DRAWINGS

FIGS. 2A-2F are side cross-sectional views of an embodiment of a method of making a semiconductor device.

FIG. 4A is a top view of a device at an intermediate step of a method of the present invention.

FIGS. 6A-6B are side cross-sectional views of portions of an alternative embodiment of the method of making a semiconductor device depicted in FIGS. 2A-2F.

FIGS. 7A-7B are side cross-sectional views of portions of an alternative embodiment of the method of making a semiconductor device depicted in FIGS. 2A-2F.

DETAILED DESCRIPTION OF THE EMBODIMENTS

An exemplary sputtering technique is magnetron sputtering, which utilizes magnetrons to excite electrons and ionized gas atoms to cause the material of a sputtering target to be deposited onto a substrate. Examples of such magnetron sputtering techniques, such as AC or DC planar or rotary magnetron sputtering are discussed in U.S. Pat. No. 7,544,884, which is hereby incorporated herein by reference in its entirety.

One example of sputtering is the deposition of materials for solar cells. Copper indium selenide ("CIS") and copper indium gallium selenide ("CIGS") materials have been recognized as effective p-type solar cell absorber layer materials for the production of high efficiency, low cost, and large scale solar cells. Copper indium selenide and copper indium gallium selenide materials may be formed by a reactive sputtering from a copper indium or copper indium gallium ("CIG") sputtering targets, respectively, in a selenium containing ambient, such as selenium gas or hydrogen selenide gas.

During production of thin-film solar cells, electrodes may be deposited onto a substrate by sputtering sodium-containing molybdenum (e.g., molybdenum doped with sodium).

One non-limiting advantage of the methods provided in embodiments of the present invention includes the manufacture of monolithic cells interconnected without the use of prefabricated interconnect components or without attaching completely separate solar cells to each other using an interconnect.

Another non-limiting advantage of the methods provided in the embodiments of the present invention includes the use of engineered shunts, such as aligned scratches or particles, to replace a scribing step in forming interconnects.

Another non-limiting advantage of the methods provided in the embodiments of the present invention includes providing a photovoltaic device on an insulating substrate.

In the following description, similar components have been labeled similarly across all figures.

Figure 1:
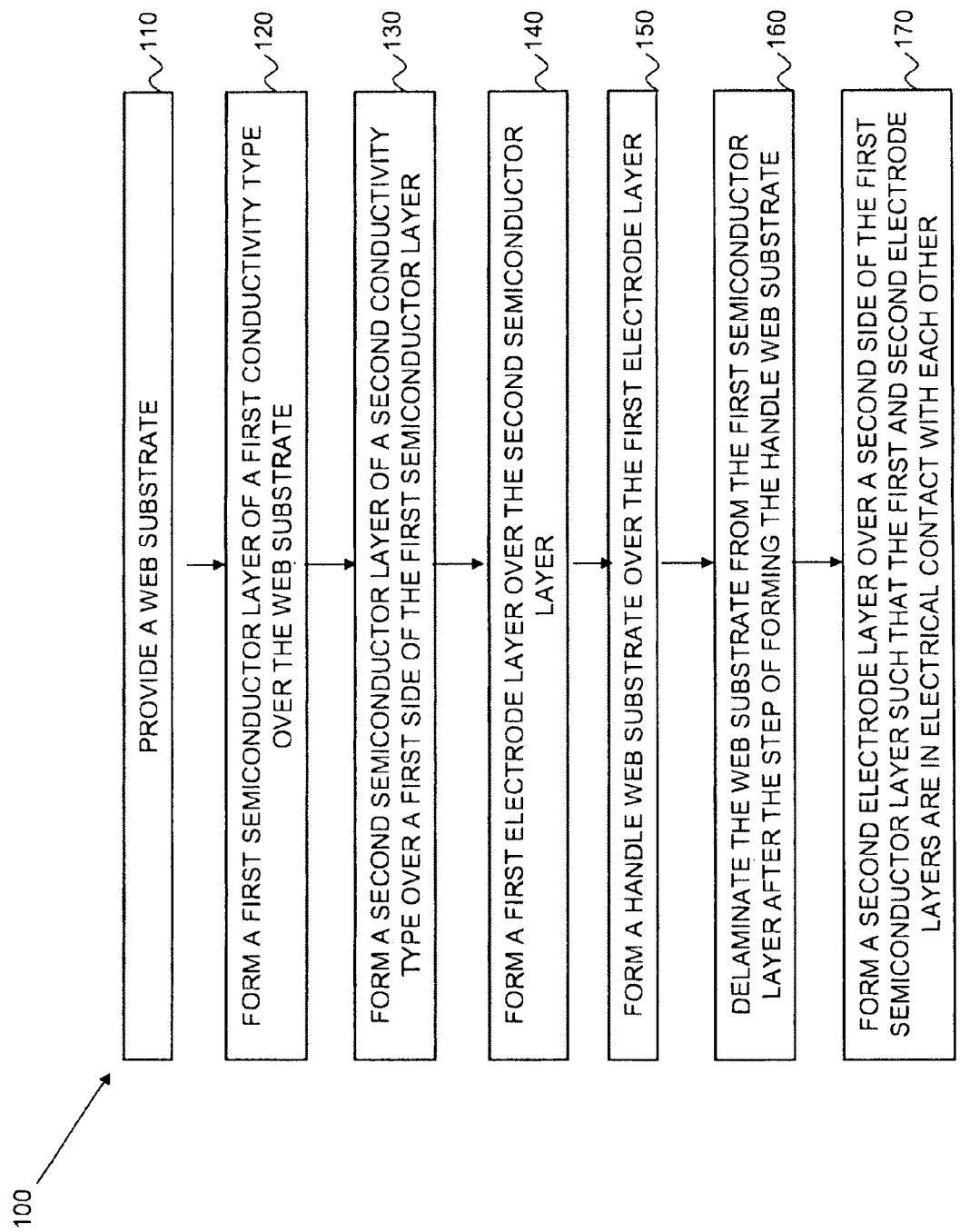
FIG. 1 is a flowchart of the steps of a method according to an embodiment of the present invention.

Referring to FIG. 1, a non-limiting embodiment of a method 100 of making a semiconductor device, for example, a photovoltaic device is shown. Beginning at step 110, a web substrate is provided. The web substrate may be provided with discrete rows or zones of particles formed thereon. For example, the rows or zones may be formed on the web substrate such that they extend in a direction substantially perpendicular to a movement direction of the web substrate. At step 120, a first semiconductor layer of a first conductivity type is formed over the web substrate. A second semiconductor layer of a second conductivity type is formed over a first side of the first semiconductor layer at step 130. At step 140, a first electrode layer (e.g., a front side electrode) is formed over the second semiconductor layer. The first electrode layer may be separated into a plurality of discrete first electrodes. A handle web substrate is formed over the first electrode layer or the plurality of discrete first electrodes at step 150. At step 160, the web substrate is delaminated from the first semiconductor layer after the step of forming the handle web substrate, such that at least one opening extends through the first and the second semiconductor layers. In an embodiment in which the particles are formed on the web substrate as discussed above, when the web substrate is delaminated from the first semiconductor layer, the particles drop away from their location and form a plurality of discrete openings through the first and second semiconductor layers. The plurality of openings may be formed directly by an absence of the particles. Alternatively, the plurality of openings may be formed indirectly through inducing fracture in a nearby area of the first and second semiconductor layer. The plurality of discrete openings are arranged in a plurality of rows or zones in a direction substantially perpendicular to a movement direction of the handle web substrate. Preferably, the first and the second semiconductor layers remain continuous between the plurality of discrete openings in each of the plurality of rows or zones. In other words, in one embodiment, the first semiconductor layer formed at step 120 is or ends up being absent at a location of each row or zone of particles and/or the second semiconductor layer formed at step 130 is or ends up being absent at a location of each row or zone of particles. Continuing on in FIG. 1, at step 170, a second electrode (e.g., a backside electrode) layer is formed over a second side of the first semiconductor layer such that the first and second electrode layers are in electrical contact with each other.

In FIGS. 2A-2F below, a method of forming a semiconductor device, for example a photovoltaic device, according to the steps shown in FIG. 1 is depicted. Where appropriate, non-limiting embodiments representing the occurrence of particular steps of the method are surrounded by dashed sections labeled according to the steps described above.

In FIG. 2A, a web substrate 10, such as a stainless steel, aluminum or titanium substrate, is provided at step 110. Other conductive or insulating substrate materials, such as other metal or polymer substrate webs may be used. In one embodiment, discussed in detail below, the web substrate may be provided with features 12, such as particles formed on the web substrate. As the substrate 10 moves in a direction represented by the imaginary arrows, it may enter a first deposition chamber (not shown) where a first semiconductor layer 14 of a first conductivity type, for example p conductivity type, is formed over the web substrate at step 120. An optional weak layer of the same material as semiconductor layer 14, but thinner than layer 14, may be formed between the substrate and layer 14. Thus, in some embodiments, a weak initial layer of the first semiconductor layer material may be formed over the web substrate prior to the formation of first semiconductor layer 14, with first semiconductor layer 14 subsequently deposited over the weak initial layer. In some embodiments, forming the first semiconductor layer 14 can include reactively alternating current (AC) magnetron sputtering a semiconductor of a first conductivity type in a first vacuum chamber from sputtering targets in a sputtering atmosphere that comprises argon gas and a selenium-containing gas. In some embodiments, the sputtering targets are conductive targets comprising copper, indium and gallium, or comprise copper, indium and aluminum. The selenium-containing gas may be hydrogen selenide or selenium vapor.

In some embodiments, the first semiconductor layer 14 may be a CIGS material. In some embodiments, the first semiconductor layer may be a graded CIS or CIGS material. In such an embodiment, multiple magnetron pairs are utilized to sputter deposit layers with increasing amounts of gallium (or aluminum), thus increasing and grading the band gap. For example, first semiconductor layer 14 may be formed so as to comprise a graded band gap from about 1 eV at the bottom to about 1.3 eV near the top of the layer.

Next, as shown in step 130, as the substrate moves in the direction of the imaginary arrows, second semiconductor layer 16 of a second conductivity type such as n-type is formed over a first side of the first semiconductor layer. For example, the second semiconductor layer 16 may be formed by a deposition process, such as magnetron sputtering in a second vacuum chamber. A suitable type of sputtering source may be, for example, rotating AC magnetrons, RF magnetrons, or planar AC magnetrons. Second semiconductor layer 16 may comprise any suitable n-type semiconductor material, such as, but not limited to ZnS, ZnSe or CdS. Other semiconductor materials, such as silicon, CdTe, etc. may be used instead for layers 14 and/or 16. The order of p and n type layers may be reversed and an optional intrinsic layer may be located between layers 14 and 16. The thickness of the first semiconductor layer 14 may be greater than that of semiconductor layer 16, or vice-versa, depending on the materials used for forming the layers. In one embodiment, semiconductor layer 14 is CIGS, semiconductor layer 16 is Cds, and the GIGS layer 14 is much thicker than layer 16.

In some embodiments the first and second semiconductor layers together are about 1 μm thick. Process conditions for sputter depositing the semiconductor layers may be found in co-pending U.S. patent application Ser. No. 12/385,571 filed on Apr. 13, 2009, the contents of which are hereby incorporated by reference in their entirety herein.

Continuing from left to right in FIG. 2A, in step 140, a first electrode layer 18 is formed over the second semiconductor layer 16. First electrode layer 18, which may also referred to as a front side or transparent top electrode layer, may comprise one or more transparent conductive layers, for example, but not limited to, one or more of an Indium Tin Oxide (ITO), Zinc Oxide (ZnO) or Aluminum Zinc Oxide (AZO) layers located over an optional resistive Aluminum Zinc Oxide (RAZO) layer. Of course, the transparent top electrode layer may comprise any other suitable materials, for example, doped ZnO or SnO, which are at least 80% transparent to solar radiation. Layer 18 may be deposited by any suitable method, such as sputtering, in a third vacuum chamber. However, all steps disclosed herein may be performed in the same chamber with no break in vacuum conditions.

Continuing on to FIG. 2B, the first electrode layer 18 may then be separated by a plurality of trenches 20 into a plurality of discrete first electrodes 19. At step 150, a handle web substrate 21 is attached to the first electrode layer 18, such as to the plurality of discrete first electrodes 19. The handle web substrate 21 may comprise one or more layers, for example a bottom layer 22 and a upper layer 24. The handle web substrate 21 may comprise a material capable of adhering to the material forming the first electrodes 19. For example, handle web substrate may comprise a layer of PET 24 and a layer of SURLYN® resin 22 available from DuPont (Wilmington, Del.). Other polymer materials 24 and other resin, adhesive or epoxy layers 22 may be used. Preferably, substrate 21 is a flexible substrate that is at least 80% transparent to solar radiation. A pair of rollers 25a and 25b, or other guiding devices, may be used to guide and/or laminate handle web substrate 21 over the plurality of discrete first electrodes 19 at a suitable controlled temperature.

In some embodiments, the substrates and layers deposited thereon may be moved by rollers, for example rollers 17a, 17b, 25a, and 25b in FIG. 2B, and/or 27 in FIG. 2C or other devices in the direction represented by the imaginary arrows. Some rollers are used not just to guide the substrate but to also separate processing areas under vacuum from processing areas in ambient. Some rollers may be bowed to spread the web, some may be movable in addition to rotatable to provide web 10, 21 steering, some may provide web tension feedback to servo controllers, and others may be mere idlers to run the web in desired positions. An input spool (not shown) and optional output spool (not shown) for each web 10, 21 thus are actively driven and controlled by feedback signals to keep the web(s) in constant tension throughout the machine. In one embodiment, the input and output modules may each contain a web splicing region or device where the web(s) 10, 21 can be cut and spliced to a leader or trailer section to facilitate loading and unloading of a web substrate roll. As a non-limiting example, some of the devices/steps may be omitted or replaced by any other suitable devices/steps. For example, bowed rollers and/or steering rollers may be omitted in some embodiments. The web substrate(s) 10, 21 are provided continuously from separate input spools, preferably located outside the vacuum chamber(s), through the vacuum or non-vacuum deposition chamber(s) for simultaneous deposition of semiconductor and upper electrode layers on different parts of the substrates 10, 21, out of deposition chambers through resist coating and scribing areas (preferably conducted in air atmosphere) as will be described below, back into a vacuum or non-vacuum deposition chamber for bottom electrode deposition, as will be described below and finally to an output spool and/or to a web cutting station (preferably conducted in air atmosphere). The web substrates 10, 21 may be positioned vertically, horizontally and/or any other direction in between. For example, the web substrate 10 may be positioned vertically and then turned horizontally by a turn bar prior to lamination of the handle web substrate 21.

As shown in FIG. 2C, in step 160, the web substrate 10 is delaminated from the first semiconductor layer 14 after forming the handle web substrate at step 150. The optional weak layer formed between the substrate and layer 14 may also be delaminated from semiconductor layer 14 along with substrate 10 at step 160. Upon delaminating the web substrate 10, at least one opening 26 extends through the first 14 and the second 16 semiconductor layers. Also upon delaminating, a second (e.g., bottom) side of the first semiconductor layer 14 may be exposed.

Figure 3C:
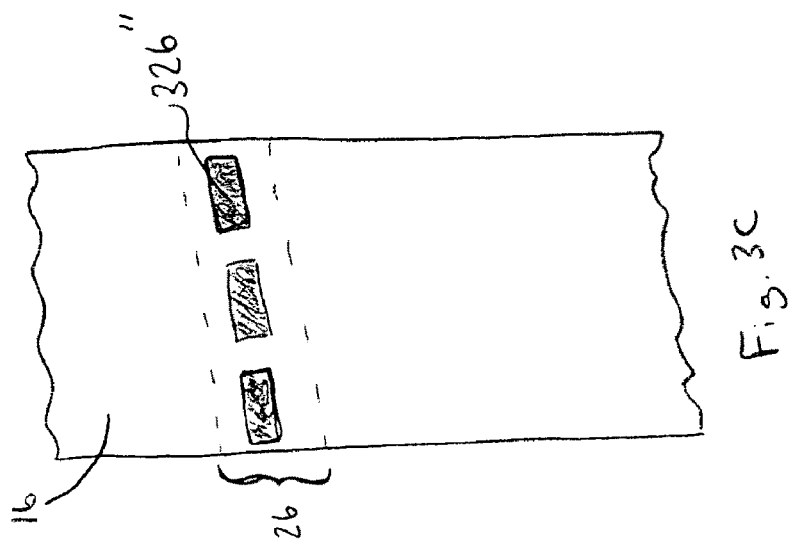
FIGS. 3A-3C are top views of alternative devices at an intermediate step of a method of the present invention.
Figure 3B:
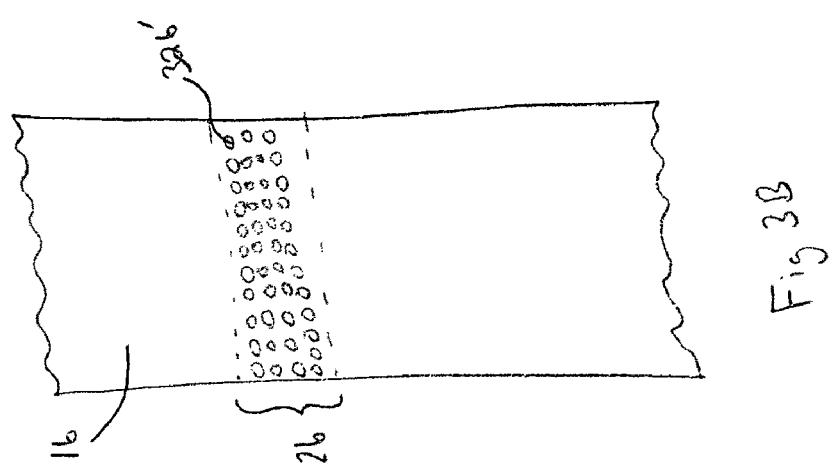
Figure 3A:
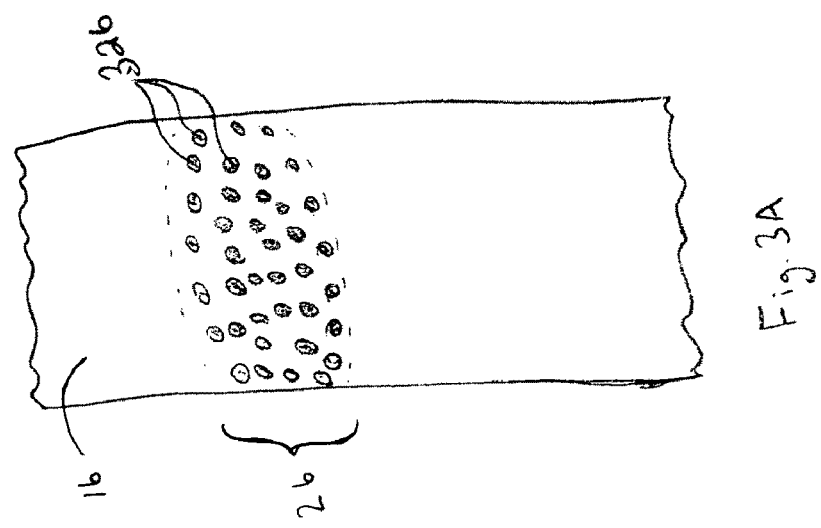

In one embodiment, such as that depicted in FIGS. 3A-C, the at least one opening 26 comprises a plurality of discrete openings 326, 326', or 326" which are arranged in at least one row or zone in a direction substantially perpendicular to a movement direction of the web substrate 10 and the handle web substrate 21, such that the first (not shown) and the second 16 semiconductor layers remain continuous between the discrete openings in the at least one row or zone. In other words, the semiconductor layers may be perforated by the discrete openings in the at least one row or zone.

In another embodiment, such as that shown in FIG. 4A, the at least one opening 26 comprises a single opening 426 positioned such that the first (not visible) and the second 16 semiconductor layers remain continuous on at least one side of the single opening 426.

Figure 5B:
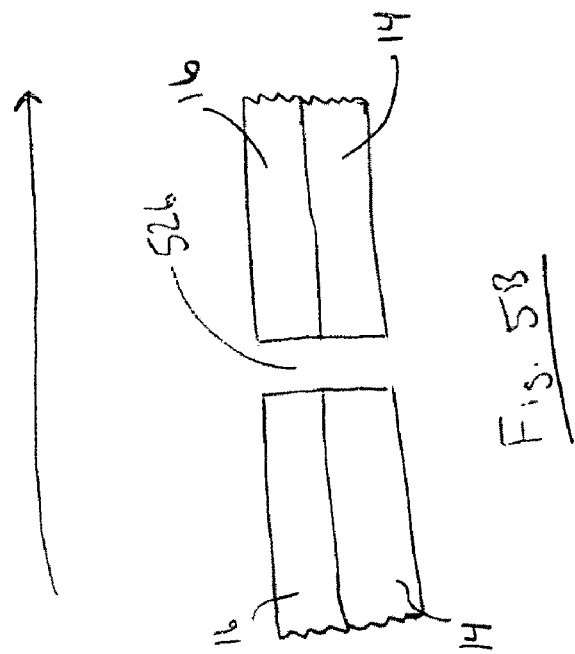
FIGS. 5A-5B top views of a device at an intermediate step of a method of the present invention.
Figure 5A:
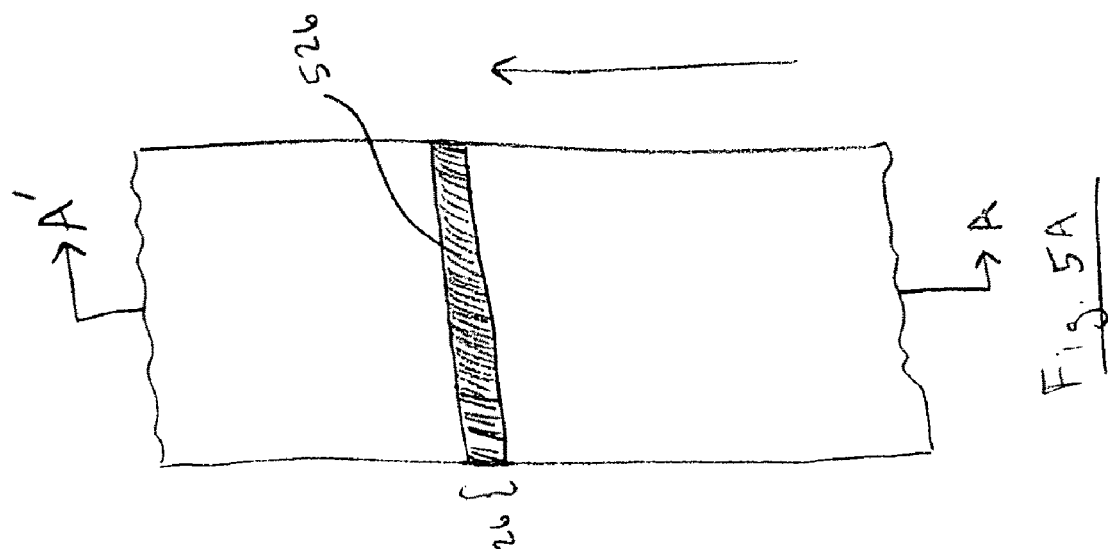

In another embodiment, such as that shown in FIGS. 5A-5B, the at least one opening 26 comprises a single opening 526 which divides the first 14 and the second 16 semiconductor layers into discrete sections, each discrete section comprising a portion of the first semiconductor layer and a portion of the second semiconductor layer. As shown in FIG. 5B, the at least one opening 26 comprises the trench 526 which extends substantially perpendicular to a movement direction of the web substrate 10 and the handle web substrate 21 (indicated by imaginary arrows pointing from left to right throughout FIGS. 2A-2C).

FIGS. 3A-3C, 4A, 5A, and 5B are not limited only to those layers shown and/or labeled. For example, the electrodes are not shown for ease of depicting and describing the openings, and the configurations and orientations of the opening(s) with respect to at least one of the semiconductor layers 14 and 16. In other words, since the handle web substrate 21 and the electrodes 19 are transparent, they are not shown in FIGS. 3A-3C, 4A, 5A and 5B.

Alternatively, in another embodiment (not shown), the at least one opening 26 may be formed through semiconductor layers 14, 16 by a subtractive process, such as etching, laser scribing (e.g., pulsed laser scribing), mechanical scribing, etc. of the semiconductor layers 14, 16. The at least one opening can be formed prior to the step of forming the handle web substrate 21 on the device or after the delamination of the web substrate 10 from the device.

Figure 6A:
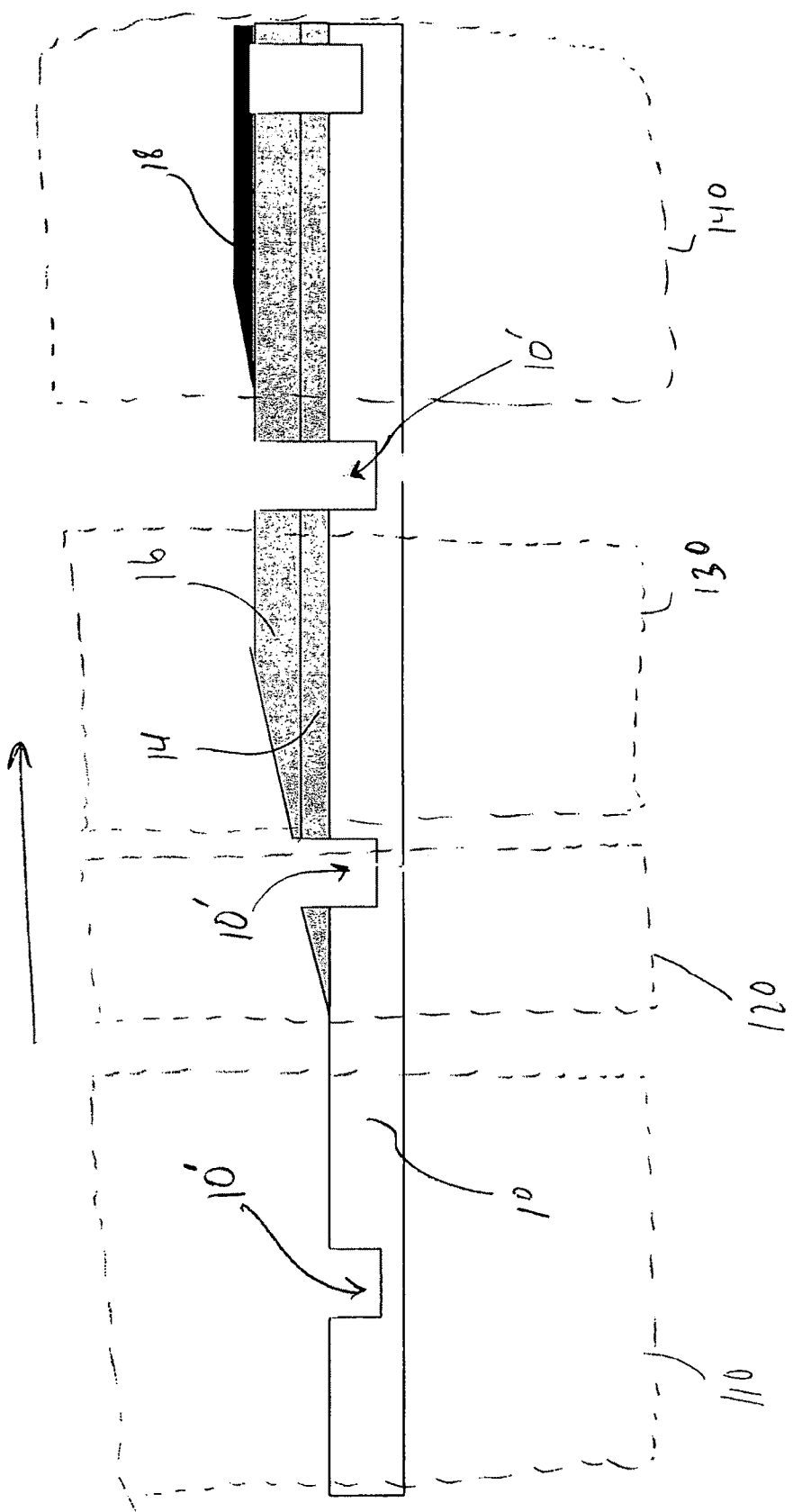

In other alternative embodiments, such as those shown in FIGS. 6A-6B and 7A-7B, a surface of the web substrate 10 may comprise at least one groove 10' or ridge 10" that extends across an entire width of the web substrate 10 substantially perpendicular to a movement direction of the web substrate, or a plurality of discrete grooves 10' or ridges 10" extending in a width direction of the web substrate substantially perpendicular to a movement direction of the web substrate. These embodiments additionally provide: (i) a step of forming the first and the second semiconductor layers in the at least one groove or over the at least one ridge, and (ii) that the step of delaminating the substrate 10 from layer 14 forms the at least one opening 26 such as shown in FIGS. 6B and 7B. Thus, rather than forming particles on web substrate 10, groove(s) and/or ridge(s) may be used instead to form the at least one opening 26 in the semiconductor layers 14, 16. In one alternative embodiment which uses groove(s) 10', the semiconductor layers 14, 16 do not completely fill the groove(s) 10' such that at least one opening 26 is formed through the layers 14, 16 at the location of each groove 10'. In another alternative embodiment which uses ridge(s) 10", the semiconductor layers 14, 16 do not completely cover the ridge(s) 10" such that at least one opening 26 is formed through the layers 14, 16 at the location of each ridge 10". In another alternative embodiment, the semiconductor layers 14, 16 do completely fill the groove(s) 10' and/or do completely cover the ridge(s) 10". However, a weak region is created in the layers 14, 16 due to the respective downward or upward curve of these layers in each respective groove or ridge. During the delamination of the web substrate 10 from layer 14, an opening 26 forms at the location of the weak regions due to the stress of the delamination. In another alternative embodiment, rather than forming groove(s) 10" in the web substrate, the web substrate 10 may comprise a perforated web containing openings or holes. In that case, the semiconductor layers 14, 16 are not formed over the holes in the substrate 10 during deposition, which automatically provides the at least one opening 26 in layers 14, 16. In another configuration, rather than having a perforated web configuration, the substrate 10 may comprise discreet but peripherally connected plates separated by holes or gaps. In that case, the semiconductor layers 14, 16 are not formed over the holes or gaps between the substrate plates during deposition, which automatically provides the at least one opening 26 in layers 14, 16.

As discussed above with respect to the embodiment described in FIGS. 3A-3C above, the at least one opening 26 may comprise openings 326, 326' or 326", respectively. To form the openings in this manner, one embodiment comprises forming discrete rows or zones of particles on the web substrate 10. For example, as shown in FIG. 2A, discrete rows or zones of particles 12 may be formed on the substrate prior to the step 120 of forming the first semiconductor layer 14. The rows or zones extend in a direction substantially perpendicular to the movement direction of the web substrate. In some embodiments, the particles may be 5-10 μm diameter particles. In some embodiments, the particles may be placed on the web substrate 10 and held to its surface by static electricity.

Subsequently, upon providing a web substrate 10 with particles 12 formed thereon, first semiconductor layer 14 and second semiconductor layer 16 can be formed over the discrete rows or zones of particles 12. In this way, at least one of (i) forming the first 14 and the second 16 semiconductor layers over the discrete rows or zones of particles 12 at step 120 in FIG. 2A; and/or (ii) the step of delaminating the substrate 10 from layer 14 at step 160 in FIG. 2C forms the plurality of openings 26.

For example, at step 160, the web substrate 10 is delaminated from the first semiconductor layer 14 by pulling it away at roller 27, causing the particles 12 and 12' to drop away from their location and form the plurality of openings 26, as shown in FIG. 2C. In other words, the plurality of openings 26 and 26' may be formed by at least one of (i) directly by an absence of the particles; and/or (ii) indirectly through inducing fracture (and possibly unintentionally created holes 26') in a nearby area of the first and the second semiconductor layers.

The delaminated web substrate 10 can optionally be taken up on an output roll and recycled as an input roll in the process described above to make additional devices. Alternatively, the web substrate 10 may optionally be in a form of a continuous loop which rotates continuously from the delamination area 160 to the deposition area 110. Substrate 10 may be a free standing loop rotating about rollers or it may be mounted on a loop shaped belt for support. The delaminated substrate may optionally pass through cleaning equipment or surface modification equipment between steps 110 and 160.

Upon forming openings 26, the method continues with the steps shown in FIG. 2D. At step 163, a photoresist or another radiation sensitive layer 29 can be formed over the second side (e.g., bottom) of the first semiconductor layer 14. For example, the resist 29 can be applied by dip coating. The resist may be applied to the second side of the first semiconductor layer by a rotating drum 61 in a resist fluid bath 63 as the first semiconductor 14 moves past the drum as shown in FIG. 2D. In other words, the step of forming the resist layer 29 comprises coating the resist layer over the second side of the first semiconductor layer 14 which is being moved by the handle web substrate 21 outside of vacuum chamber(s). The resist layer 29 fills the plurality of openings 26 including those located in the plurality of rows or zones such as at location 29'. Resist 29 also fills at least one unintentionally created hole 26' in at least the first semiconductor layer at location 29".

At step 165, the resist layer 29 is exposed in an exposure area 30 such that the resist layer is stabilized (e.g., crosslinked by the radiation) in the area where it is formed in at least one unintentionally created hole 26', for example at location 29". In other words, photoresist 29 is not stabilized in those areas where it fills the plurality of openings 26 located in the plurality of rows or zones, for example at location 29'. The photoresist is exposed to radiation source 32 through the handle web substrate 21, and electrodes 19. The resist is not stabilized at locations where semiconductor layers 16 and 14 are formed between the resist and the radiation source because the semiconductor layers are not transparent to the radiation from source 32. The exposure or radiation source may be, for example, a UV flash lamp. The resist may be formed as a uniform and continuous coating. The step 165 of selectively exposing the resist layer preferably includes exposing the resist layer 29 through a first mask 31 which prevents exposure of the resist layer at location 29' where layer 29 is located in each one of the plurality of openings 26 in the plurality of rows or zones, while the handle web substrate 21 is moving. Thus, the step 165 of selectively exposing the resist layer also includes exposing the resist layer through the first 14 and the second 16 semiconductor layers which act as a second mask, such that the resist layer is only stabilized in the at least one unintentionally created hole at locations where the first and the second semiconductor layers are missing. In other words, resist layer 29 formed in the at least one unintentionally created hole, such as at location 29", is stabilized.

In the description provided above with respect to treatment of the photoresist layer, in one embodiment, mask 31 can be a wire, or a plurality of wires, which act to shade those areas not to be stabilized from exposure by radiation source 32. In one embodiment, mask 31 remains stationary as substrate 21 moves from left to right as indicated by the imaginary arrows. In another embodiment, mask 31 moves over and along with substrate 21 from left to right. For example, mask 31 begins at some starting point to the left of the radiation source 32. Mask 31 then moves with the substrate 21, and past the exposure area 30 and radiation source 32, and shades those portions over which the photoresist 29 should not be stabilized. Upon passing to the right of the exposure area 30 and radiation source 32, mask 31 cycles back to the starting point discussed above. Mask 31 can be a single mask, or a series of masks formed on a continuous loop (e.g., a rotating wire cage), or a mask in combination with a stepper to control the motion of the mask, so long as it shades those portions of photoresist not to be stabilized while traversing the exposure area 30. In this embodiment, rather than using a UV flash lamp 32, a continuous UV lamp 32 may be used instead.

At step 167, the resist layer 29 is removed or washed by developer or solvent 33 from all locations except where it was stabilized by the selective exposure in step 165. For example, a non-aqueous solvent may be applied to the photoresist in order to remove the non-stabilized portions 29'. In other words, resist 29' which fills opening(s) 26 is removed in a washing or removing step 167, and opening 26 is again exposed and unfilled. Additional portions of resist layer 29, such as at portions not at unintentionally created holes 26', and on the second surface of the first semiconductor layer 14 may also be removed during the washing and removing step 167. Portions of stabilized resist 29" at unintentionally created holes 26' remain joined to semiconductor layers 16 and 14 and ensure that no electrical contact can take place at these locations when the second electrode is subsequently deposited.

As shown in FIG. 2E, a second electrode layer can be formed over the second (e.g. back) side of the first semiconductor layer 14 at step 170, such that the first and second electrode layers are in electrical contact with each other. In other words, second electrode layer 13 may be formed over the second side of the first semiconductor layer 14 and may fill the at least one opening 26, both of which are exposed upon washing and removing photoresist 29 in step 167. The step of depositing the second electrode layer 13 may comprise sputtering a transition metal layer, such as molybdenum, from a target by DC sputtering, AC sputtering, or RF sputtering. The second electrode layer 13 can comprise an alkali-containing transition metal, such as sodium containing molybdenum.

Subsequently, the second electrode layer 13 is separated into a plurality of discrete second electrodes. The second electrode layer may be separated by a plurality of trenches 36 as shown in FIG. 2F. Trenches 36 may be formed by a laser or mechanical scribing process. In other words, step 170 of forming the second electrode layer comprises forming the second electrode layer 13 over the second side of the first semiconductor layer 14 and in the at least one opening 26. Step 170 may be followed by scribing the second electrode layer to separate the second electrode layer 13 into a plurality of discrete second electrodes 15, for example at trenches 36. Rollers 35a, 35b, 37a and 37b guide the substrate 21.

In summary, as shown in FIG. 2A, the first semiconductor layer 14, the second semiconductor layer 16 and the first electrode layer 18 are formed by sputtering over the web substrate 10 while the web substrate is moving as indicated by the imaginary arrows shown from left to right. As shown in FIG. 2E, the second electrode layer 13 is formed by sputtering over the second side of the first semiconductor layer 14 while the handle web substrate 21 is moving in a direction depicted by the imaginary arrows extending from left to right.

Figure 8:
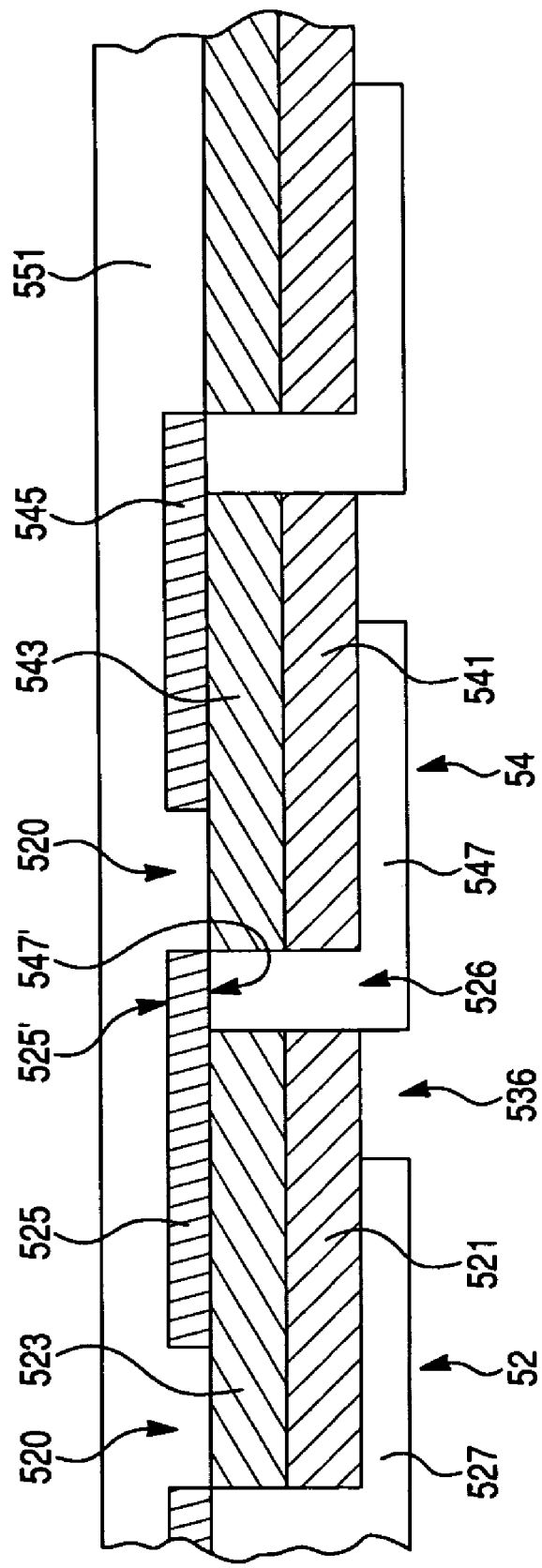
FIG. 8 is a side cross sectional view of a semiconductor device according to an embodiment of the present invention.

As further shown in FIGS. 2F and 8, one embodiment includes forming a series of photovoltaic cells 50. The series of photovoltaic cells may 50 comprise a first photovoltaic cell 52 defined by one first electrode and second electrode pair, and a second photovoltaic cell 54 defined by another first electrode and second electrode pair. Trenches 20, 520 separating the plurality of discrete first electrodes 19, 525 are offset from trenches 36, 536 separating the plurality of discrete second electrodes 15, 527. An overlap portion 525' of the first electrode 525 of the first photovoltaic cell 52 overlaps an overlap portion 547' of the second electrode 547 of the second photovoltaic cell 54. Thus, the at least one opening 26 may be formed such that it extends through the first 14 and the second 16 semiconductor layers in a location where the overlap portion 525' of the first electrode 525 of the first photovoltaic cell 52 overlaps the overlap portion 547' of the second electrode 547 of the second photovoltaic cell 54. Additionally, at least a part 547" of the overlap portion 547' of the second electrode 547 of the second photovoltaic cell 54 extends through the at least one opening 26 to electrically contact at least a part of the overlap portion 525' of the first electrode 525 of the first photovoltaic cell 52. In other words, regardless of the number of photovoltaic cells formed by method 100, in each of the cells, each of the plurality of discrete first electrodes can be in electrical contact with a respective one of the plurality of the discrete second electrodes.

As shown in FIG. 8, the first photovoltaic cell 52 includes a first portion 521 of a first semiconductor layer 14 of a first conductivity type, a first portion 523 of a second semiconductor layer 16 of a second conductivity type, a first electrode 525 contacting the first portion 523 of the second semiconductor layer 16, and a second electrode 527 contacting the first portion 521 of the first semiconductor layer 14. The second photovoltaic cell 54 includes a second portion 541 of the first semiconductor layer 14 of the first conductivity type, a second portion 543 of the second semiconductor layer 16 of the second conductivity type, a first electrode 545 contacting the second portion 543 of the second semiconductor layer 16, and a second electrode 547 contacting the second portion 541 of the first semiconductor layer 14. In this arrangement, the second electrode 547 of the second photovoltaic cell 54 electrically contacts the first electrode 525 of the first photovoltaic cell 52. As a result, the second electrode 547 of the second photovoltaic cell 54 electrically shorts at least one of: (a) the first portion 521 of the first semiconductor layer 14 to the first portion 523 of the second semiconductor layer 16; (b) the second portion 541 of the first semiconductor layer 14 to the second portion 543 of the second semiconductor layer; (c) the first portion 521 of the first semiconductor layer 14 to the second portion 541 of the first semiconductor layer 14; and/or (d) the first portion 523 of the second semiconductor layer 16 to the second portion 543 of the second semiconductor layer 16.

In another embodiment, portion 547" of the second electrode 547 of the second photovoltaic cell 54 electrically shorts all of: (a) the first portion 521 of the first semiconductor layer to the first portion 523 of the second semiconductor layer; (b) the second portion 541 of the first semiconductor layer to the second portion 543 of the second semiconductor layer; (c) the first portion 521 of the first semiconductor layer to the second portion 541 of the first semiconductor layer; and (d) the first portion 523 of the second semiconductor layer to the second portion 543 of the second semiconductor layer.

In some embodiments, the first semiconductor layer 14 comprises a CIS based semiconductor layer, the second semiconductor layer 16 comprises CdS, the web substrate 10 comprises a metal web, the first electrode layer 18 comprises a transparent conductive layer, the second electrode layer 13 comprises molybdenum and the handle web substrate 21 comprises a polymer web.

In some embodiments, the semiconductor device comprises a monolithic (e.g., formed from continuous semiconductor layers on the same substrate rather than comprising separate cells with a separate interconnect) photovoltaic device in which each of the plurality of photovoltaic cells comprises a portion of the first semiconductor layer, a portion of the second semiconductor layer, one discrete first electrode and one discrete second electrode.

Thus, the first 52 and the second 54 photovoltaic cells can be located on a common substrate, for example a handle web substrate 21 which is attached to the first electrodes 525 and 545 of the first 52 and the second 54 photovoltaic cells. The second electrode 547 of the second photovoltaic cell 54 can fill at least one opening 26 through the first and the second semiconductor layers located between the first and the second photovoltaic cells at location 526. Thereby, the second electrode 547 of the second photovoltaic cell 54 electrically contacts each of the first portion 521 of the first semiconductor layer 14, the first portion 523 of the second semiconductor layer 16, the second portion 541 of the first semiconductor layer 14, and the second portion 543 of the second semiconductor layer 16.

As discussed above, the at least one opening can be a plurality of discrete openings which extend in at least one row or zone between the first and the second photovoltaic cells, such that the first and the second semiconductor layers remain continuous between the openings in the at least one row or zone. In another embodiment, the first and the second semiconductor layers can remain continuous around the at least one opening.

While sputtering was described as the preferred method for depositing all layers onto the substrate, some layers may be deposited by MBE, CVD, evaporation, plating, etc., while, preferably, the CIS based alloy is reactively sputtered.

Optionally, one or more antireflection (AR) films (not shown) may be deposited over the transparent top electrode, to optimize the light absorption in the cell, and/or current collection grid lines may be deposited over the top conducting electrode.

In embodiments described above, the phrase "a movement direction of the web substrate" means the direction that either the web substrate or the handle web substrate are moving upon formation of openings in the first and second semiconductor layers at the moment the web substrate is delaminated or begins to be delaminated from the first semiconductor layer.

Additionally, features discussed herein have been illustrated in the figures for clarity of description. The figures do not reflect the true scale of the various features and any variation in feature size shown in the figures should not be construed as limiting the invention.

While the use of multiple vacuum chambers has been discussed above in the description of the embodiments, the invention is not so limited. The embodiments described herein may comprise method steps for forming a semiconductor or photovoltaic device all of which are performed in a single chamber with no break in vacuum conditions.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on an representative implementation of a photovoltaic device and battery. The present invention, however, is not limited to a representative implementation as described and depicted. Those skilled in the art will recognize that the device and methods of the present invention may be practiced using various combinations of components. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of making a semiconductor device, comprising:
    providing a web substrate;
    forming a first semiconductor layer of a first conductivity type over the web substrate;
    forming a second semiconductor layer of a second conductivity type over a first side of the first semiconductor layer;
    forming a first electrode layer over the second semiconductor layer;
    forming a handle web substrate over the first electrode layer;
    delaminating the web substrate from the first semiconductor layer after the step of forming the handle web substrate, wherein at least one opening extends through the first and the second semiconductor layers; and
    forming a second electrode layer over a second side of the first semiconductor layer such that the first and second electrode layers are in electrical contact with each other.

2. The method of claim 1, wherein the semiconductor device comprises a photovoltaic device.

3. The method of claim 2, further comprising separating the first electrode layer into a plurality of discrete first electrodes and separating the second electrode layer into a plurality of discrete second electrodes.

4. The method of claim 3, wherein:
    the photovoltaic device comprises a series of photovoltaic cells, comprising a first photovoltaic cell defined by one first electrode and second electrode pair, and a second photovoltaic cell defined by another first electrode and second electrode pair;
    trenches separating the plurality of first electrodes are offset from trenches separating the plurality of second electrodes;
    an overlap portion of the first electrode of the first photovoltaic cell overlaps an overlap portion of the second electrode of the second photovoltaic cell;
    the at least one opening extends through the first and the second semiconductor layers in a location where the overlap portion of the first electrode of the first photovoltaic cell overlaps the overlap portion of the second electrode of the second photovoltaic cell; and
    at least a part of the overlap portion of the second electrode of the second photovoltaic cell extends through the at least one opening to electrically contact at least a part of the overlap portion of the first electrode of the first photovoltaic cell; and
    each of the plurality of discrete first electrodes is in electrical contact with a respective one of the plurality of the discrete second electrode.

5. The method of claim 4, wherein the at least one opening comprises a plurality of discrete openings which are arranged in at least one row or zone in a direction substantially perpendicular to a movement direction of the web substrate, such that the first and the second semiconductor layers remain continuous between the discrete openings in the at least one row or zone.

6. The method of claim 4, wherein the at least one opening comprises a single opening positioned such that the first and the second semiconductor layers remain continuous on at least one side of the single opening.

7. The method of claim 4, wherein the at least one opening comprises a single opening which divides the first and the second semiconductor layers into discrete sections, each discrete section comprising a portion of the first semiconductor layer and a portion of the second semiconductor layer.

8. The method of claim 7, wherein the at least one opening comprises a trench which extends substantially perpendicular to a movement direction of the web substrate.

9. The method of claim 4, wherein the at least one opening is formed by laser or mechanical scribing prior to the step of forming the handle web substrate.

10. The method of claim 4, wherein:
a surface of the web substrate comprises at least one groove or ridge, comprising one groove or ridge which extends across an entire width of the web substrate substantially perpendicular to a movement direction of the web substrate or a plurality of discrete grooves or ridges extending in a width direction of the web substrate substantially perpendicular to a movement direction of the web substrate; and
at least one of forming the first and the second semiconductor layers in the at least one groove or over the at least one ridge or the step of delaminating forms the at least one opening.

11. The method of claim 5, further comprising forming discrete rows or zones of particles on the web substrate prior to the step of forming the first semiconductor layer, wherein the rows or zones extend in a direction substantially perpendicular to the movement direction of the web substrate.

12. The method of claim 11, wherein:
the at least one opening comprises a plurality of discrete openings which extend in a plurality of rows or zones in a direction substantially perpendicular to the movement direction of the web substrate, such that the first and the second semiconductor layers remain continuous between the openings in each of the plurality of rows or zones; and
at least one of forming the first and the second semiconductor layers over the discrete rows or zones of particles or the step of delaminating forms the plurality of openings.

13. The method of claim 12, wherein the step of delaminating the web substrate from the first semiconductor layer causes the particles to drop away from their location and forms the plurality of openings by at least one of directly by an absence of the particles or indirectly through inducing fracture in a nearby area of the first and the second semiconductor layers.

14. The method of claim 13, further comprising:
forming a resist layer over the second side of the first semiconductor layer such that the resist layer fills the plurality of openings located in the plurality of rows or zones and fills at least one unintentionally created hole in at least the first semiconductor layer due to a presence of at least one particle or other defect on the substrate web or in the first or the second semiconductor layer in a location other than one of the plurality of rows or zones;
selectively exposing the resist layer such that the resist layer is stabilized in the at least one unintentionally created hole but is not stabilized in the plurality of openings located in the plurality of rows or zones; and
removing or washing the resist layer from all locations except where it was stabilized by the selective exposure.

15. The method of claim 14, wherein:
the step of forming the resist layer comprises coating the resist layer over the second side of the first semiconductor layer which is being moved by the handle web substrate;
the step of selectively exposing the resist layer comprises exposing the resist layer through a first mask which prevents exposure of the resist layer located in each one of the plurality of openings located in the plurality of rows or zones while the handle web substrate is moving; and
the step of selectively exposing the resist layer further comprises exposing the resist layer through the first and the second semiconductor layers which act as a second mask, such that the resist layer is only stabilized in the at least one unintentionally created hole at locations where the first and the second semiconductor layers are missing.

16. The method of claim 4, wherein the step of forming the second electrode layer comprises forming the second electrode layer over the second side of the first semiconductor layer and in the at least one opening followed by scribing the second electrode layer after the step of delaminating to separate the second electrode layer into a plurality of discrete second electrodes.

17. The method of claim 16, wherein:
the first semiconductor layer, the second semiconductor layer, and the first electrode layer are formed by sputtering over the web substrate while the web substrate is moving; and
the second electrode layer is formed by sputtering over the second side of the first semiconductor layer while the handle web substrate is moving.

18. The method of claim 2, wherein the first semiconductor layer comprises CIS based semiconductor layer, the second semiconductor layer comprises CdS, the web substrate comprises a metal web, the first electrode layer comprises a transparent conductive layer, the second electrode layer comprises molybdenum and the handle web substrate comprises a polymer web.

19. The method of claim 4, wherein the device comprises a monolithic photovoltaic device in which each of the plurality of photovoltaic cells comprises a portion of the first semiconductor layer, a portion of the second semiconductor layer, one discrete first electrode and one discrete second electrode.

20. The method of claim 19, wherein:
the second electrode of the second photovoltaic cell electrically shorts at least one of:
(a) a first portion of the first semiconductor layer to a first portion of the second semiconductor layer;
(b) a second portion of the first semiconductor layer to a second portion of the second semiconductor layer;
(c) the first portion of the first semiconductor layer to the second portion of the first semiconductor layer; or
(d) the first portion of the second semiconductor layer to the second portion of the second semiconductor layer.

21. A method of making a photovoltaic device, comprising:
providing a web substrate;
forming discrete rows or zones of particles on the web substrate, wherein the rows or zones extend in a direction substantially perpendicular to a movement direction of the web substrate;
forming a first semiconductor layer of a first conductivity type over the web substrate, wherein the first semiconductor layer is or ends up being absent at a location of each row or zone of particles;

forming a second semiconductor layer of a second conductivity type over a first side of the first semiconductor layer, wherein the second semiconductor layer is or ends up being absent at a location of each row or zone of particles;

forming a first electrode layer over the second semiconductor layer;

separating the first electrode layer into a plurality of discrete first electrodes;

forming a handle web substrate over the plurality of discrete first electrodes;

delaminating the web substrate from the first semiconductor layer after the step of forming the handle web substrate, such that the particles drop away from their location and form a plurality of discrete openings through the first and the second semiconductor layers by at least one of directly by an absence of the particles or indirectly through inducing fracture in a nearby area of the first and the second semiconductor layers, wherein the plurality of discrete openings are arranged in a plurality of rows or zones in a direction substantially perpendicular to a movement direction of the web substrate, and wherein the first and the second semiconductor layers remain continuous between the plurality of discrete openings in each of the plurality of rows or zones;

forming a second electrode layer over a second side of the first semiconductor layer and in the plurality of discrete openings; and separating the second electrode layer into a plurality of discrete second electrodes, such that each of the plurality of discrete first electrodes is in electrical contact with a respective discrete second electrode.

22. The method of claim 21, further comprising:

forming a resist layer over the second side of the first semiconductor layer such that the resist layer fills the plurality of openings located in the plurality of rows or zones and fills at least one unintentionally created hole in at least the first semiconductor layer due to a presence of at least one particle or other defect on the substrate web or in the first or the second semiconductor layers in a location other than one of the plurality of rows or zones;

selectively exposing the resist layer such that the resist layer is stabilized in the at least one unintentionally created hole but is not stabilized in the plurality of openings located in the plurality of rows or zones; and removing or washing the resist layer from all locations except where it was stabilized by the selective exposure.

23. The method of claim 22, wherein:

the step of forming the resist layer comprises coating the resist layer over the second side of the first semiconductor layer which is being moved by the handle web substrate;

the step of selectively exposing the resist layer comprises exposing the resist layer through a first mask which prevents exposure of the resist layer located in each one of the plurality of openings located in the plurality of rows or zones while the handle web substrate is moving; and the step of selectively exposing the resist layer further comprises exposing the resist layer through the first and the second semiconductor layers which act as a second mask, such that the resist layer is only stabilized in the at least one unintentionally created hole at locations where the first and the second semiconductor layers are missing.

24. The method of claim 21, wherein:

the first semiconductor layer, the second semiconductor layer, and the first electrode layer are formed by sputtering over the web substrate while the web substrate is moving;

the second electrode layer comprises is formed by sputtering over the second side of the first semiconductor layer while the handle web substrate is moving followed by scribing the second electrode material; and the first semiconductor layer comprises a CIS based semiconductor layer, the second semiconductor layer comprises CdS, the web substrate comprises a metal web, the first electrode layer comprises a transparent conductive layer, the second electrode layer comprises molybdenum and the handle web substrate comprises a polymer web.

* * * * *